(12) United States Patent
Haczewski et al.

(10) Patent No.: US 6,545,536 B1
(45) Date of Patent: Apr. 8, 2003

(54) BIASING CIRCUIT FOR $V_{GS}$ DRIFT AND THERMAL COMPENSATION OF A POWER DEVICE

(75) Inventors: Andrzej Haczewski, Oulu (FI); Sandro Lanfranco, Oulu (FI)

(73) Assignee: Nokia Corporation, Espoo (FI)

(*) Notice: Subject to any disclaimer, the term of this patent is extended or adjusted under 35 U.S.C. 154(b) by 0 days.

(21) Appl. No.: 10/030,257

(22) PCT Filed: Jul. 9, 1999

(86) PCT No.: PCT/EP99/04848

§ 371 (c)(1),
(2), (4) Date: Feb. 20, 2002

(87) PCT Pub. No.: WO01/05027

PCT Pub. Date: Jan. 18, 2001

(51) Int. Cl.[7] .............................. H03F 1/30; H03F 3/04; H03G 5/16
(52) U.S. Cl. ..................... 330/149; 330/132; 330/302
(58) Field of Search ................................. 330/132, 149, 330/302

(56) References Cited

U.S. PATENT DOCUMENTS

| | | | | |
|---|---|---|---|---|
| 3,626,279 A | * | 12/1971 | Walden | 324/328 |
| 5,047,909 A | * | 9/1991 | Hosoda | 363/40 |
| 5,049,832 A | | 9/1991 | Cavers | 330/149 |
| 5,103,189 A | | 4/1992 | Camiade | 330/277 |
| 5,661,437 A | | 8/1997 | Nishikawa et al. | 330/282 |
| 5,898,338 A | | 4/1999 | Proctor et al. | 330/149 |
| 6,400,822 B1 | * | 6/2002 | Anozie | 379/398 |

FOREIGN PATENT DOCUMENTS

| | | | | |
|---|---|---|---|---|
| EP | 0 413 625 A1 | 2/1991 | | H03F/3/193 |
| EP | 0 771 068 A1 | 5/1997 | | H03F/1/32 |

OTHER PUBLICATIONS

Cavers, "Amplifier Linearization Using a Digital Predistorter with Fast Adaptation and Low Memory Requirements", IEEE Transactions on Vehicular Technology, vol. 39 Nov. 1, 1990, No. 4, New York, US, pp. 374–382.

* cited by examiner

*Primary Examiner*—Patricia Nguyen
(74) *Attorney, Agent, or Firm*—Cohen, Pontani, Lieberman & Pavane

(57) ABSTRACT

The present invention proposes a method for adjusting a parameter (IDQ) of a power device (1) by changing an input signal (VG) to said power device, said method comprising the steps of taking (S2) a sample of an output signal (POUT) of said power device (1), detecting (S5) at least a first and a second signal component level (P1ST, P2ND) of said sampled output signal (POUT), processing (S6) the at least detected first and second signal component level (P1ST, P2ND), deciding on the basis of a result obtained in said processing step (S6), whether a compensation of a change of said parameter (IDQ) is required, and if such a change is to be compensated, determining (S8) a changing value (V) for said input signal (VG) and adjusting (S9) the parameter (IDQ) by changing said input signal (VG) by said determined changing value (V). Furthermore, the present invention proposes a corresponding device.

16 Claims, 6 Drawing Sheets

BIASING CIRCUIT FOR $V_{GS}$ DRIFT AND THERMAL COMPENSATION OF A POWER DEVICE

PRIORITY CLAIM

This is a national stage of PCT application No. PCT/EP99/04848, filed on Jul. 9, 1999. Priority is claimed on that application.

FIELD OF THE INVENTION

The present invention relates to a method for adjusting a parameter of a power device by changing an input signal to said power device, and also to a corresponding device. In particular, the present invention is directed to a method and corresponding device for compensating a performance change of a transistor by adjusting a bias point.

BACKGROUND OF THE INVENTION

Power devices using for example semiconductor elements such as field effect transistors (FET) or metal oxide silicon (MOS) FET's are widely spread in various technology fields. Said power devices are designed for power amplification and able to handle high voltages and large currents. A major problem in the usage of such power devices mentioned above is to keep the performance such as linearity, amplifier gain, output power and the like e.g. of the used semiconductor element constant over a long period of time. This is in particular important for variable envelope signals.

Due to thermal effects (e.g. self heating or external heating), aging and the like, characteristic parameters of the transistor can be changed. Therefore, a constant performance, in particular the linearity of the semiconductor element, can not be guaranteed over a long period of time. However, for an effective usage of the power device, a constant performance (e.g. linearity) is extremely important.

Therefore, hitherto several solutions are proposed to keep the performance of such a power device, i.e. of the semiconductor element such as a MOSFET transistor, as stable as possible in time. One conventional solution is to detect the drain current ID through a resistor connected in series. A bias controlling is then performed on the basis of this detected current. However, due to the insertion of the resistor it is possible that in the case of a high power the drain voltage can be significantly changed. Moreover, any resistive element introduced in the path may decrease the efficiency of the amplifier.

Another known solution is to separate a cell of the transistor structure and use a signal measured therefrom as a DC reference to compensate a drain current change. However, this can be prepared only by the element manufacturer since this solution requires a new element architecture.

SUMMARY OF THE INVENTION

Therefore, it is an object of the present invention to provide a method and also a corresponding device for controlling an output signal of a power device by changing an input signal to said power device which are free from the above mentioned drawbacks.

According to the present invention, this object is achieved by a method for adjusting a parameter of a power device by changing an input signal to said power device, said method comprising the steps of taking a sample of an output signal of said power device, detecting at least a first and a second signal component level of said sampled output signal, processing the at least detected first and second signal component level, deciding on the basis of a result obtained in said processing step, whether a compensation of a change of said parameter is required, and if such a change is to be compensated, determining a changing value for said input signal and adjusting the parameter by changing said input signal by said determined changing value.

Furthermore, the present invention proposes a device for adjusting a parameter of a power device by changing an input signal to said power device, said device comprising a coupler means for taking a sample of an output signal of said power device, at least two detector means, respectively, for detecting at least a first and a second signal component level of said sampled output signal, and a feedback circuit adapted to process the at least detected first and second signal component level, to decide on the basis of a result obtained in said processing, whether a compensation of a change of said parameter is required, and if such a change is to be compensated, to determine a changing value for said input signal and to adjust the parameter by changing said input signal by said determined changing value.

According to the present invention, the proposed method and/or device require no change in the element architecture. Also, an element such as a resistor is not needed within the network, therefore the risk of further changes of performance, for example at high power, is prevented.

Moreover, the present invention provides a circuit which does almost consume no RF power and which is easy to implement. Furthermore, it is possible to compensate drift effects of e.g. a drain current over a long period of time, for example due to aging, but also short time changes, for example due to a quick temperature change of the semiconductor element. As the control is related directly to the linearity of the semiconductor element (i.e. transistor), a bias controlling method according to the invention works very accurate. In particular, as no interruption is required for measurement or adjusting the present invention provides an effective control of the power device.

Preferred embodiments of the invention are described herein below in detail by way of example with reference to the accompanying drawings.

DESCRIPTION OF PREFERRED EMBODIMENTS

Transistors are operated in defined classes, the so-called class of operation. Said class of operation depends on the quiescent current of the transistor. Transistors used in the present invention have to work in class AB or class B of operation. In the above mentioned classes, harmonics of the fundamental signal are generated which are used in the present invention.

The present invention starts from the consideration that levels of harmonics (fundamental frequency, second harmonic and the like) of an output signal of an power amplifier (transistor) depend on a bias point set for the transistor. Therefore, a ratio of signals concerning the fundamental frequency and e.g. the second harmonic can be used for monitoring effects influencing the bias point (see also FIG. 6).

The following description of the theory is based upon the terminology of FET or MOSFET transistors. However, also other power devices such as bipolar transistors or the like may be used.

Figure 5A:
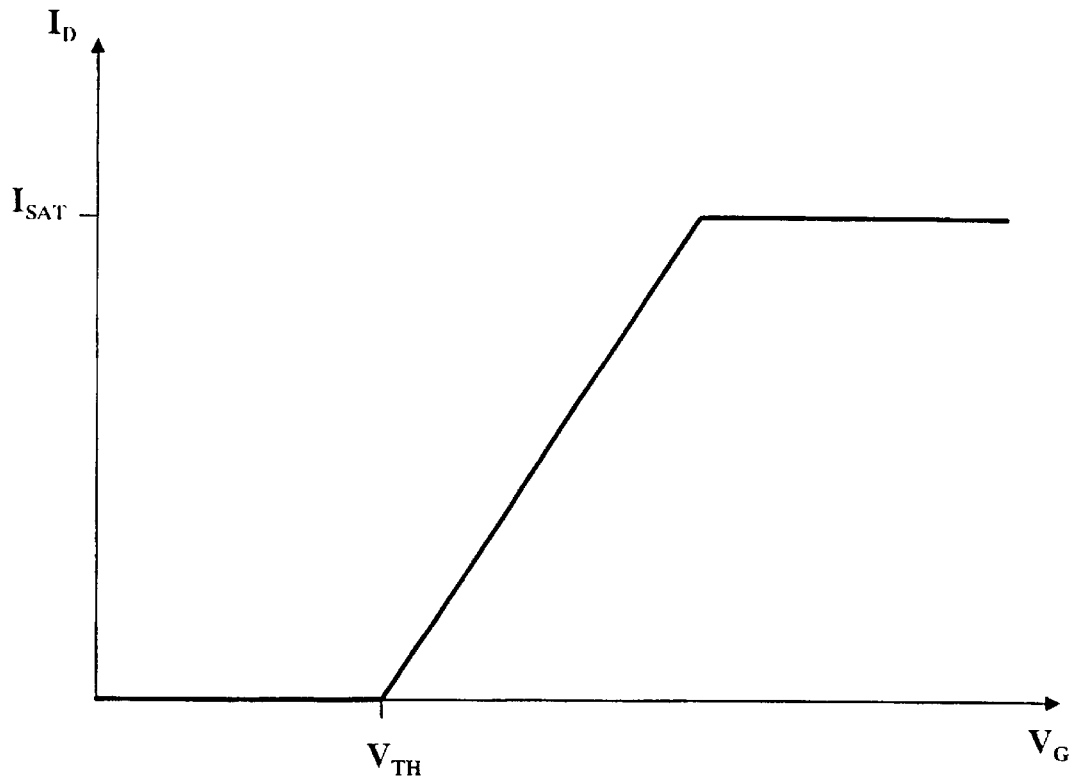
FIGS. 5A and 5B are schematic diagrams showing characteristics of a transistor.

In FIG. 5A, an idealized transfer characteristic of a transistor as mentioned above is shown. When a gate voltage VG is below a threshold level VTH, a drain current ID is zero. When the gate voltage VG is increased above said threshold level the drain current increases until it reaches the saturation current ISAT (which is also known as open channel current).

Figure 5B:
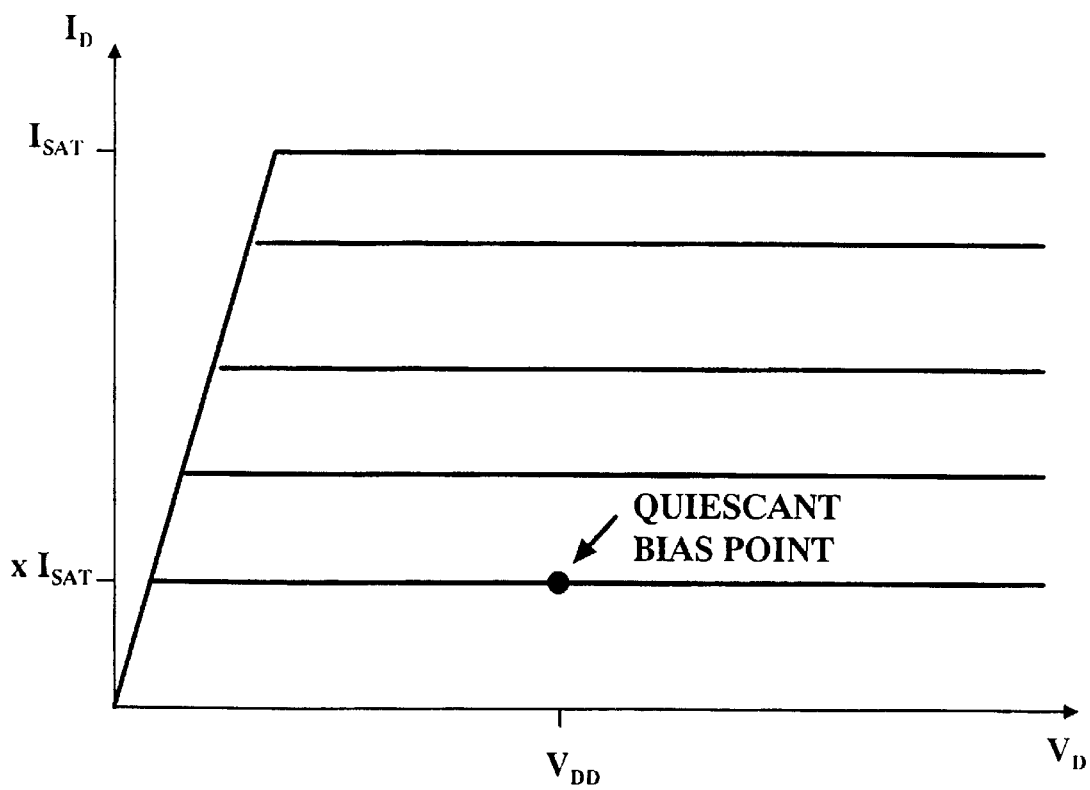

In FIG. 5B the drain current ID is shown as a function of the drain voltage VD. Here, a parameter x is indicated which is defined as the ratio between the quiescent drain current IDQ and the saturation current ISAT (i.e. the maximum drain current ID). A quiescent bias point is defined at the current value when the drain voltage is VDD which is the supply voltage. Said quiescent bias point corresponds to the quiescent drain current IDQ at a drain voltage VD=VDD.

Figure 6:
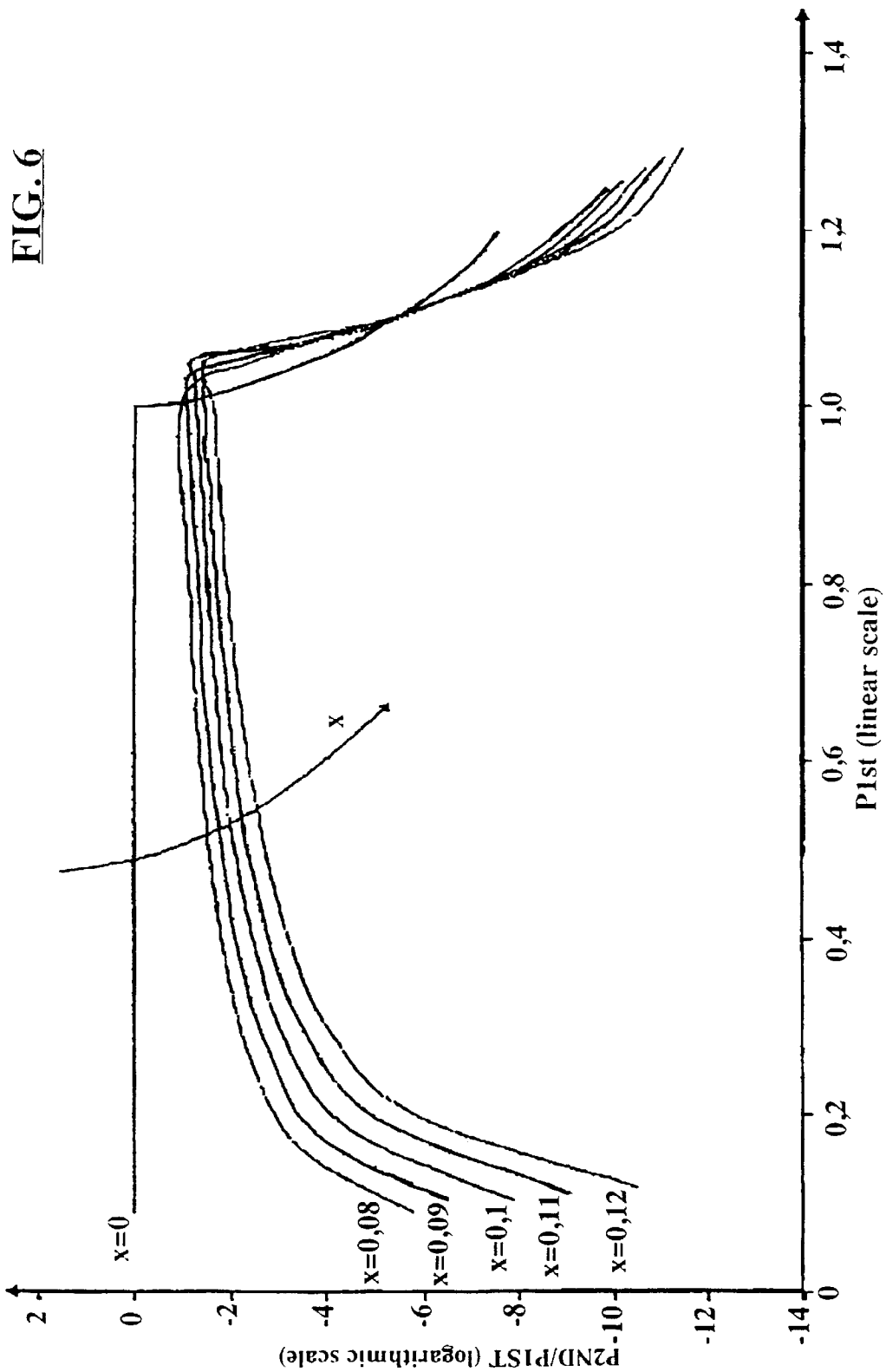
FIG. 6 is a diagram illustrating a ratio of output signals of a transistor for different parameters.

In FIG. 6, a graph is shown which represents the power ratio of the second harmonic and the fundamental frequency of an output power signal of the transistor as a function of the power of the fundamental frequency of the output power signal. There are different curves each of which represents a different value x, i.e. a different quiescent drain current IDQ. Typical values of the parameter x for a class AB amplifier (or transistor) are for example 0.08 to 0.12. For a class B amplifier, x is zero. As shown in FIG. 6, the position of the curves depends not only on the power at the fundamental frequency but also on the bias point of the transistor. When the value of the output power is fixed, the ratio of the second harmonic and the fundamental frequency depends just on the parameter x, i.e. on the quiescent drain current IDQ. This offers the opportunity to correct the quiescent drain current IDQ which may be changed by aging and the like as mentioned above by using e.g. a measurement of the levels of the fundamental frequency and the second harmonic of the output signal of a transistor. Results of said measurement can be used to change the gate voltage in order to adjust the bias point (i.e. the quiescent drain current). As an indicator of the need of correction the ratio between the fundamental frequency and the second harmonic is used.

Since thermal changes influence also the quiescent drain current IDQ, the ratio between the fundamental frequency and the second harmonic can be used correspondingly. Therefore, the present invention can also be used to compensate thermal effects on the transistor.

By using the above described theoretical consideration, the present invention provides a method for adjusting the bias point of a transistor e.g. of a MOSFET transistor (power device) by tapping the output power and detecting signal components such as the levels of the fundamental frequency and second harmonic of the original output signal for determining a performance change. Said method is described below with reference to FIG. 1. It is to be mentioned that for describing the method a flow chart enclosing several steps is used although the method according to the present invention may also be performed simultaneously.

Figure 1:
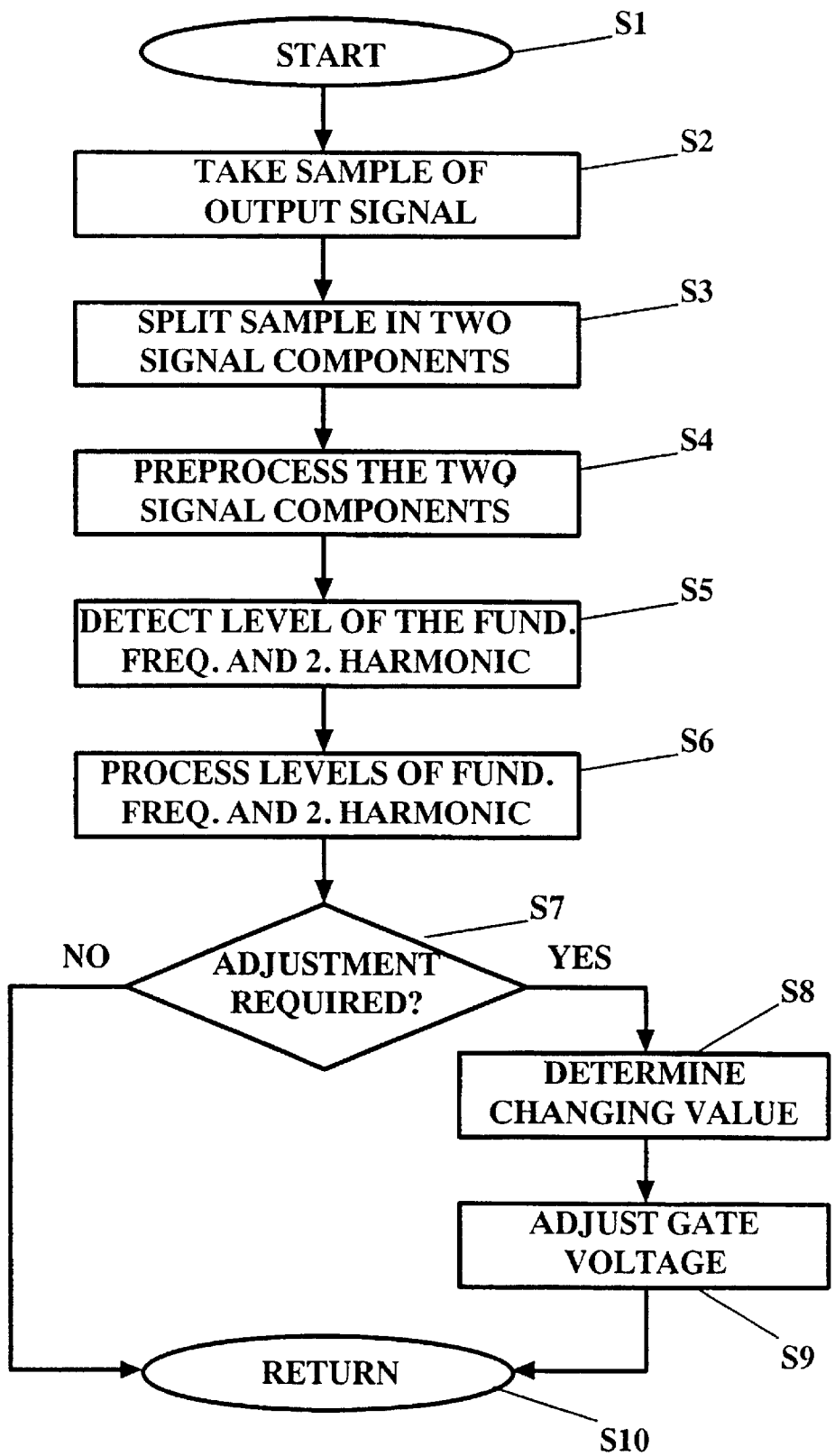
FIG. 1 is a flowchart describing the method according to the present invention.

In FIG. 1, after starting the control procedure in step S1, a sample of an output signal, i.e. of an output power POUT of a transistor which is e.g. a laterally diffused metal oxide semiconductor (LDMOS) transistor, is taken. Here, to take a sample of the output signal may also be understood as tapping the output signal continuously. Said output signal may have the form of a RF signal.

The sampled output signal POUT is split in two signal parts corresponding each other (step S3). In step S5, from one of these signal parts a level of the fundamental frequency P1st of the original output signal is detected, while from the other signal a level of the second harmonic P2nd of the original output signal is detected. It is to be noted that in said detecting step S5 the RF signals are converted into DC signals.

Then, in step S6, the detected levels of the fundamental frequency and second harmonic P1st, P2nd are processed. In said processing step S6, in the case that the detected levels are for example proportional to the logarithm of the power, the second harmonic level P2nd is subtracted from the fundamental frequency level P1st to obtain a difference or error signal. In other cases (i.e. the detected levels are not proportional to the logarithm of the power, e.g. they are proportional to the power itself), another kind of calculation is required. In the above mentioned case of being proportional to the power itself, for example a ratio between the second harmonic level P2nd and the fundamental frequency level P1st is required for the processing in step S6.

The obtained result is used to decide whether a changing of an input signal to said transistor 1 (i.e. of the output signal POUT of said transistor 1) is required (step S7) for a compensation of a performance change. This decision can be made for example merely by checking the difference signal (e.g. whether it is zero or not, when the output power of the transistor is at a constant value). Another possibility is to compare said difference signal with predetermined values each of said values relating to a respective changing value.

If the decision in step S7 is negative, i.e. no compensation of a change of the output signal (i.e. of the performance) is required, the process returns directly to the beginning (step S10) and the control procedure is restarted. If the decision in step S7 is positive, i.e. a compensation is required, in step S8 a changing value ΔV for the input signal of the transistor to adjust the quiescent drain current IDQ (i.e. of the bias point) of the transistor is determined. As mentioned above, said changing value ΔV may be determined either by using the difference signal obtained in said processing step S6 itself or by using predetermined values compared with said difference signal to obtain a respective changing value. The signal to be changed for adjusting the bias point is for example in case of the above mentioned LDMOS the gate voltage VG which influences the quiescent drain current IDQ. In step S9, said gate voltage VG is changed according to the determined changing value ΔV. Thereafter, the process returns also to the beginning of the control procedure (step S10).

As an alternative, it is also possible that after splitting the sampled output signal POUT in step S3 and before detecting the fundamental frequency level and the second harmonic level in step S5, the split signal components are preprocessed in step S4, if required. Said preprocessing step may be an attenuation of one or both of said split signal components (or of a frequency part) for an adequate detection in said detecting step S5. For example, at least one of said split signals may be lowered by several dB (e.g. 20–40 dB), especially for the detection of the fundamental frequency level P1st. Additionally, at least one of said split signals my be filtered, for example to obtain an adequate signal level of the second harmonic for the detection, i.e., the fundamental frequency in the original signal has to be lowered in comparison to the second harmonic (for example by 10 dB).

Figure 2:
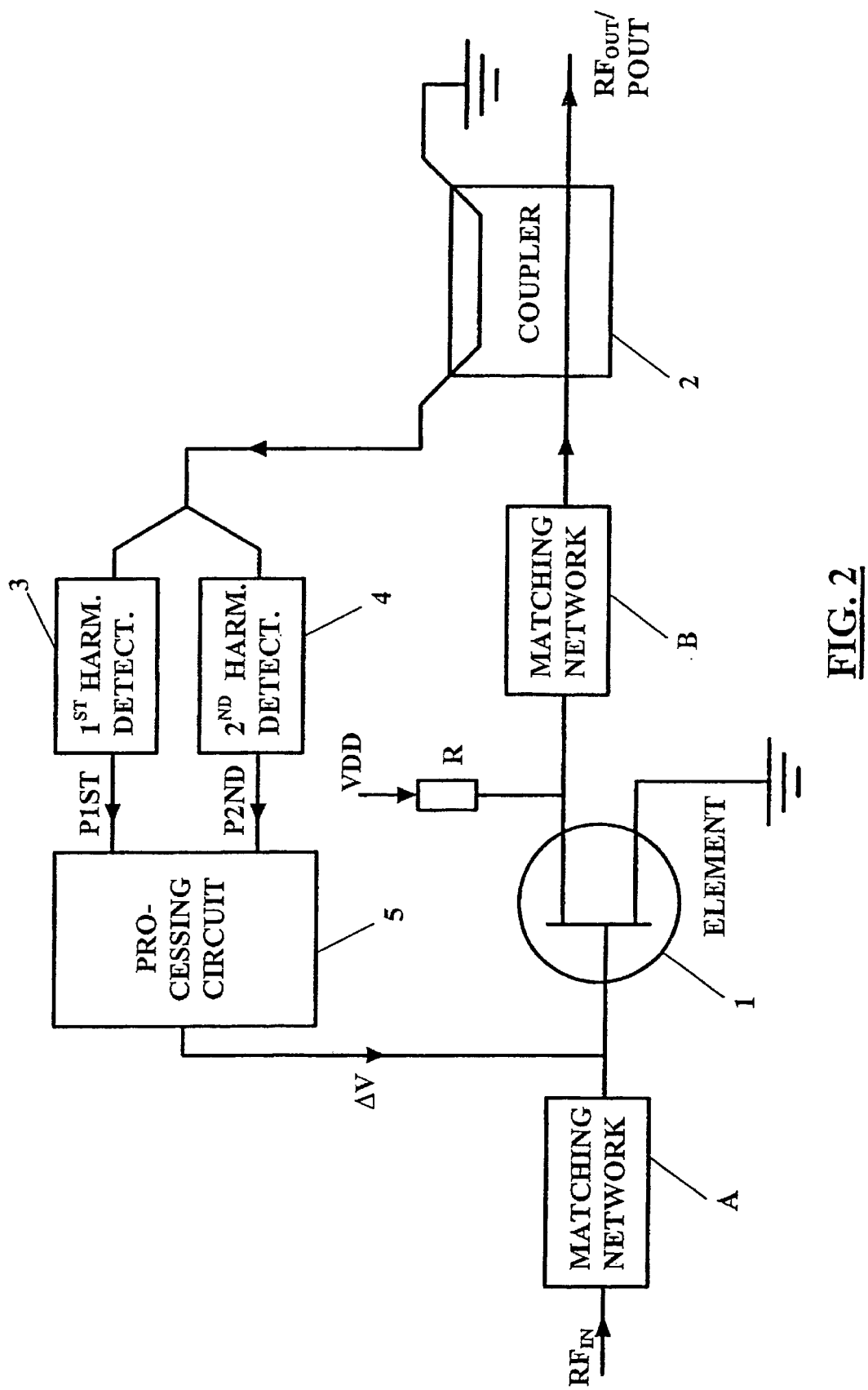
FIG. 2 is a block circuit diagram showing a device according to a first embodiment.

In the following, with reference to FIG. 2, a first example of a device adapted to perform the above described method is described. Here, a device for controlling the bias point of a transistor 1 used as the power device by monitoring the output signal of said transistor 1 is shown. The transistor, e.g. a LDMOS transistor, is to be operated in class AB or B.

The drain of transistor 1 is connected via an electrical element E such as a resistor or an inductor to a power supply VDD. The source of the transistor is grounded. Reference numerals A and B respectively denote matching networks connected to the transistor 1. Reference numeral 2 denotes a coupler for taking a sample of the output signal POUT. Said coupler 2 is for example an output power control coupler. Reference numeral 3 denotes a detector for detecting the level of the fundamental frequency P1st of the sampled output signal POUT and reference numeral 4 denotes a detector for detecting the level of the second harmonic P2nd of the sampled output signal POUT. As mentioned above, the detectors are adapted to convert the RF output signal into a DC signal for further processing. Said detectors 3, 4 are for example diodes, log detectors or the like.

Reference numeral 5 denotes a DC feedback circuit. The levels of the fundamental frequency and the second harmonic detected by said detectors 3, 4 are fed to input terminals of said feedback circuit 5. In said circuit 5, the input levels (DC signals) are processed, e.g. subtracted and compared, as described above. An example of such a feedback circuit is given herein below with reference to FIG. 4.

The DC feedback circuit decides whether and by which value the quiescent drain current (and therefore the bias point) of the transistor 1 is to be adjusted in order to compensate a performance change (recognized by monitoring the output signal POUT). Therefore, it outputs a changing value ΔV to change for example the gate voltage VG as an input signal of the transistor used as the power device to keep the performance of the transistor constant.

Figure 3:
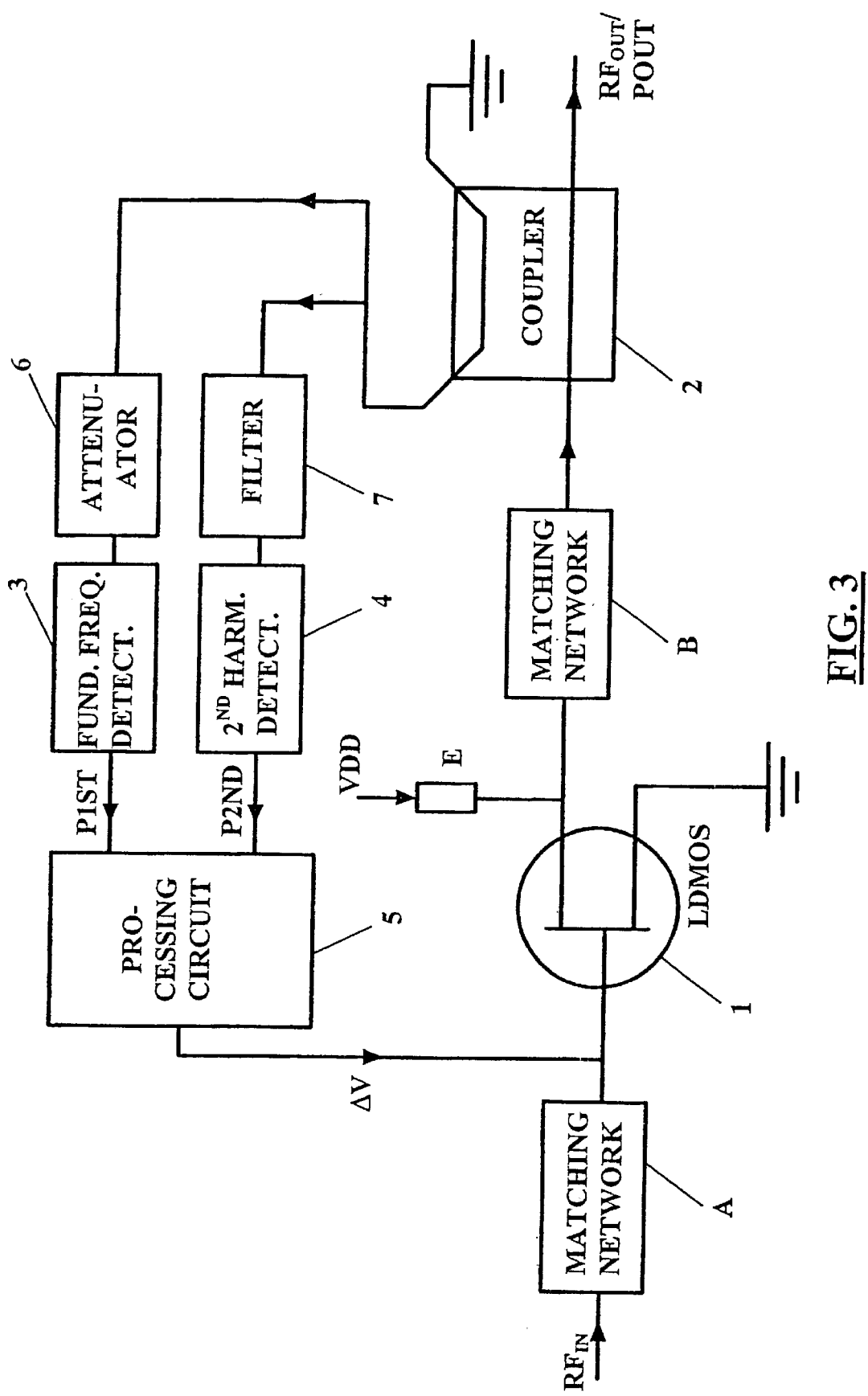
FIG. 3 is a block circuit diagram showing a device according to a second embodiment.

In a second embodiment of the present invention, a device shown in FIG. 3 is used. Here, in additional to the above described means A and B and 1 to 5, preprocessing means 6 and 7 are included. In the path to the detector 3 for the fundamental frequency an attenuator 6 is included. Said attenuator 6 is used to lower the split signal supplied to the detector 3 for the fundamental frequency by several dB, e.g. in order to reach a signal level equal to that one of the second harmonic (for example by 20 to 40 dB). The attenuator 6 is for example a so-called T-attenuator built of chip resistors.

Furthermore, in the path of the detector 4 for the second harmonic, a filter 7 is included. Said filter 7 is used with the split signal of the original sampled output signal POUT to filter out the fundamental frequency, or at least to lower it, for an effective detection of the second harmonic in the detector 4 (e.g. fundamental frequency is 10 dB lower than second harmonic). For this purpose, for example a pass band filter or, in some cases, a notch filter can be used.

In addition to the above described circuit elements 6 and 7 in the second embodiment, it is also possible to add further elements such as attenuators or filters in the paths of the device. This depends on the levels of the harmonics to be detected. For example, in the path to the detector 3 for the fundamental frequency, also a filter to preprocess the split signal may be required.

In the following, an example of a circuit used as the DC feedback circuit applicable in the first as well as in the second embodiment is shown with reference to FIG. 4. Here, a simplified implementation is described which can be used for example in the case that the power is constant and the input (DC) signals from the detectors 3, 4 described above are proportional to the value of power expressed in dBm (i.e. to the logarithm of the power) and nearly at the same level. However, if other preconditions take place, the structure of the DC feedback circuit has to be changed accordingly to receive a correct output used as a changing value to adjust the bias point of the transistor.

Figure 4:
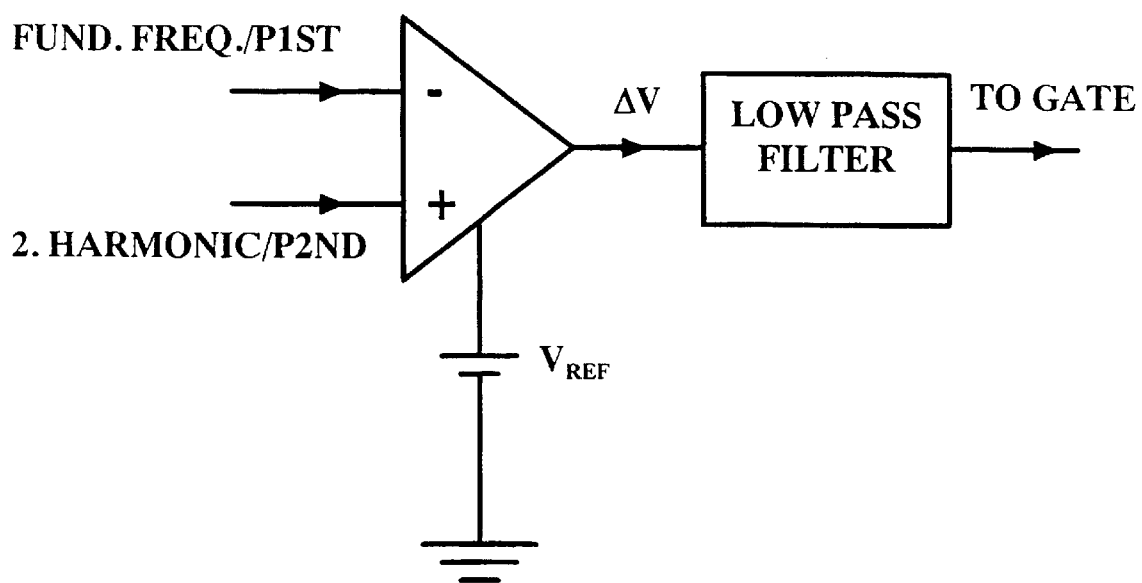
FIG. 4 is a block circuit diagram showing one element of the device according to the embodiments.

In FIG. 4, the DC signal corresponding to the detected level of the fundamental frequency P1st is supplied to the negative input of an differential amplifier and the DC signal corresponding to the detected level of the second harmonic P2nd is supplied to the positive input of said differential amplifier. That means, the output signal ΔV of the differential amplifier, which is the above mentioned error or difference signal, depends only on the ratio of the DC signals corresponding to the fundamental frequency and the second harmonic. As a reference, a fixed external voltage source VREF may be used.

Alternatively, for example in the case of a wider dynamic range of the output power to be tapped, a look up table (not shown) may be used as a reference to determine by which value the gate voltage VG is to be changed for a correct adjustment. Then, the changing value ΔV is fed via a low pass filter to the transistor 1 to adjust the gate voltage VG (i.e. quiescent current IDQ).

It is to be mentioned, since the difference signal ΔV depends only on an averaged envelope of harmonics, that the present invention is generally able to work independently of the kind of modulation used for the original output signal.

As a preferred implementation, the present invention is used within one stage of a power amplifier. In the above, as semiconductor element of the power device, a laterally diffused metal oxide semiconductor (LDMOS) transistor is mentioned. However, it is obvious that the present invention is also applicable to any other power device which is to be stabilized over a long period of time.

In order to reach a high efficiency the DC signals supplied from both detectors 3, 4 should not differ much. This can be reached by corresponding measures like the above described attenuation. Furthermore, to improve the efficiency, the changing (i.e. adjusting) level range for the gate voltage may be limited by a predetermined threshold value, for example if the output signal POUT is dropping down far and/or fast.

Although in the present invention described above the fundamental frequency and the second harmonic are used for the adjustment of the semiconductor element 1, it is also possible to use one or more of the third, forth etc. harmonics for the calculation of the adjustment level. In this case, the method and device according to the present invention may be modified very easily to take into account these parameters.

The present invention proposes a method for adjusting a parameter IDQ of a power device 1 by changing an input signal VG to said power device, said method comprising the steps of taking S2 a sample of an output signal POUT of said power device 1, detecting S5 at least a first and a second signal component level P1ST, P2ND of said sampled output signal POUT, processing S6 the at least detected first and second signal component level P1ST, P2ND, deciding on the basis of a result obtained in said processing step S6, whether a compensation of a change of said parameter IDQ is required, and if such a change is to be compensated, determining S8 a changing value ΔV for said input signal VG and adjusting S9 the parameter IDQ by changing said input signal VG by said determined changing value ΔV. Furthermore, the present invention proposes a corresponding device.

It should be understood that the above description and accompanying figures are merely intended to illustrate the present invention by way of example only. The preferred embodiments of the present invention may thus vary within the scope of the attached claims.

What is claimed is:

1. A method for adjusting a parameter (IDQ) of a power device (1) by changing an input signal (VG) to said power device, said method comprising the steps of:
    taking (S2) a sample of an output signal (POUT) of said power device (1),
    detecting (S5) a first power level of the fundamental frequency (P1ST) and a second power level of the $2^{nd}$ or higher order harmonic (P2ND) of said sampled output signal (POUT),
    processing (S6) the detected first and second power level (P1ST, P2ND),
    deciding (S7) on the basis of a result obtained in said processing step (S6), whether a compensation of a change of said parameter (IDQ) is required, and
    if such a change is to be compensated, determining (S8) a changing value (ΔV) for said input signal (VG) and
    adjusting (S9) the parameter (IDQ) by changing said input signal (VG) by said determined changing value (ΔV).

2. A method according to claim 1, wherein
    said power device (1) is a transistor and
    said parameter is a quiescent drain current (IDQ) used as an indicator of a bias point of said transistor.

3. A method according to claim 1, wherein said output signal (POUT) is an output power of said power device (1).

4. A method according to claim 2, wherein said input signal (VG) is a gate voltage of said transistor (1).

5. A method according to claim 1, further comprising the steps of:
    splitting (S3) the sampled output signal (POUT) into at least a first and a second signal, and
    preprocessing (S4) said first and second power level used in the detecting step (S5).

6. A method according to claim 5, wherein in said preprocessing step (S4) at least one frequency part of at least one of said split signals is attenuated by a predetermined value.

7. A method according to claim 1, wherein in said processing and deciding steps (S6, S7) a predetermined type of calculation is performed using a DC value corresponding to the first power level (P1ST) and a DC value corresponding to the second power level (P2ND), said predetermined type of calculation depending on a proportionality of said DC values to the output signal (POUT).

8. A method according to claim 1, wherein in said determining step (S8) the changing value (ΔV) of said input signal (VG) is determined on the basis of a comparison of the result obtained in said processing step (S6) with values of a look up table containing respective changing values (ΔV).

9. A device for adjusting a parameter (IDQ) of a power device (1) by changing an input signal (VG) to said power device, said device comprising:
    a coupler means (2) adapted to take a sample of an output signal (POUT) of said power device (1),
    detector means (3, 4) adapted to detect a first power level of the fundamental frequency (P1ST) and a second power level of the $2^{nd}$ or higher order harmonic (P2ND) of said sampled output signal (POUT), and
    a processing circuit (5) adapted to process the detected first and second power level (P1ST, P2ND), to decide on the basis of a result obtained in said processing, whether a compensation of a change of said parameter (IDQ) is required, and if such a change is to be compensated, to determine a changing value (ΔV) for said input signal (VG) and to adjust the parameter (IDQ) by changing said input signal (VG) by said determined changing value (ΔV).

10. A device according to claim 9, wherein
    said power device (1) is a transistor and
    said parameter is a quiescent drain current (IDQ) used as an indicator of a bias point of said transistor.

11. A device according to claim 9, wherein said output signal (POUT) is an output power of said power device (1).

12. A device according to claim 10, wherein said input signal (VG) is a gate voltage of said transistor (1).

13. A device according to claim 9, further comprising:
    means adapted to split the sampled output signal (POUT) into at least a first and a second signal, and
    preprocessing means (6, 7) for preprocessing said first and second power levels supplied to the detector means (3, 4).

14. A device according to claim 13, wherein said preprocessing means (6, 7) is adapted to attenuate at least one frequency part of at least one of said split signals by a predetermined value.

15. A device according to claim 9, wherein said processing circuit (5) is adapted to perform a predetermined type of calculation using a DC value corresponding to the first power level (P1ST) and a DC value corresponding to the second power level (P2ND), said predetermined type of calculation depending on a proportionality of said DC values to the output signal (POUT).

16. A device according to claim 9, wherein said feedback circuit (5) is adapted to determine the changing value (ΔV) of said input signal (VG) on the basis of a comparison of the obtained result with values of a look up table containing respective changing values (ΔV).

* * * * *